United States Patent
Nishimura (10) Patent No.: US 7,780,868 B2
(45) Date of Patent: Aug. 24, 2010

(54) ALKALINE ETCHING SOLUTION FOR SEMICONDUCTOR WAFERS AND ALKALINE ETCHING METHOD

(75) Inventor: Shigeki Nishimura, Yamaguchi (JP)

(73) Assignee: Siltronic AG, Munich (DE)

( * ) Notice: Subject to any disclaimer, the term of this patent is extended or adjusted under 35 U.S.C. 154(b) by 548 days.

(21) Appl. No.: 11/899,182

(22) Filed: Sep. 5, 2007

(65) Prior Publication Data

US 2008/0064222 A1 Mar. 13, 2008

(30) Foreign Application Priority Data

Sep. 7, 2006 (JP) .............................. 2006-243350

(51) Int. Cl.
B44C 1/22 (2006.01)
C23F 1/00 (2006.01)
C03C 15/00 (2006.01)
C03C 25/68 (2006.01)
C25F 3/00 (2006.01)

(52) U.S. Cl. ......................................... 216/99; 438/753
(58) Field of Classification Search .................. 216/99; 438/753; 252/79.1, 79.5
See application file for complete search history.

(56) References Cited

U.S. PATENT DOCUMENTS

| | | | |
|---|---|---|---|
| 5,714,407 A | 2/1998 | Maeno et al. | |
| 6,168,725 B1 | 1/2001 | Achari et al. | |
| 7,192,886 B2 * | 3/2007 | Paw et al. | 438/753 |
| 7,579,309 B2 * | 8/2009 | Abbadie et al. | 510/175 |
| 2001/0006246 A1 | 7/2001 | Kwag et al. | |
| 2003/0136941 A1 | 7/2003 | Vohra et al. | |
| 2004/0072437 A1 | 4/2004 | Iizuka et al. | |
| 2005/0133759 A1 | 6/2005 | Nishimura | |

FOREIGN PATENT DOCUMENTS

| | | |
|---|---|---|
| EP | 1923618 A | 2/2008 |
| GB | 1 278 499 A | 6/1972 |
| GB | 1 588 843 A | 4/1981 |
| GB | 1 717 286 A1 | 11/2006 |
| JP | 2003229392 A | 8/2003 |
| KR | 10-0154252 | 12/1998 |
| KR | 2005-0063733 | 6/2005 |
| KR | 2000-0004840 A | 1/2009 |
| WO | 2004/027840 A2 | 4/2004 |

* cited by examiner

Primary Examiner—Roberts Culbert
(74) Attorney, Agent, or Firm—Brooks Kushman P.C.

(57) ABSTRACT

Alkaline etching solutions capable of improving a surface roughness even with a relatively low alkaline concentration, contain bromate or both bromate and nitrate. An alkaline etching method using the solution produces silicon wafers with improved surface roughness.

9 Claims, 4 Drawing Sheets

ALKALINE ETCHING SOLUTION FOR SEMICONDUCTOR WAFERS AND ALKALINE ETCHING METHOD

BACKGROUND OF THE INVENTION

1. Field of the Invention

The present invention relates to a field of semiconductor-wafer manufacturing technology and, in particular, to a novel alkaline etching solution for silicon wafers, an alkaline etching method using the solution, a silicon-wafer manufacturing method using the solution, and further a silicon wafer obtained through use of the method.

2. Background Art

When a silicon wafer for use in integrated circuits, such as ICs and LSIs, and discrete semiconductor elements, such as transistors and diodes, the monocrystal obtained through a Czochralski method (CZ method) or a floating-zone method (FZ method) is cut off by using an inner-diameter-blade cutter or a wire saw, the edges are beveled, and afterwards a lap process (lapping) is performed for improving the flatness on a main surface with free abrasive grains, wet etching is performed for removing a process distortion applied to the wafer through the above-mentioned processes and then mirror polishing is performed. Such wet etching includes acid etching using a mixed acid of, for example, hydrofluoric acid, nitric acid, and acetic acid, and alkaline etching using alkali, such as sodium hydroxide or potassium hydroxide.

While acid etching has an advantage capable of controlling the etching rate and the state of the surface of the wafer after etching, a drawback of the large etching rate is a deterioration in flatness of the wafer which had been improved through the lapping process.

On the other hand, although the etching rate is slow, alkaline etching has the advantage of being capable of minimizing changes in flatness of the wafer obtained in the lapping process, thereby achieving a wafer with excellent flatness after etching. In recent years, to allow finer microfabrication, an extremely high-level flatness has been demanded for semiconductor wafers. For this reason, alkaline etching has been widely used.

In the alkaline etching technology that has been used so far, an alkaline component with a concentration smaller than 48 to 50 weight percent in an alkaline etching solution has widely been used. However, such widely used alkaline etching solutions exhibit anisotropy in which an etching speed on a (100) surface and an etching speed on a (111) surface are different from each other by approximately sixty to one hundred times. This poses a problem in which a concave portion (hereinafter referred to as a "facet") occurs on the surface of the wafer, and asperities remain on the surface of the wafer after etching. If such asperities on the surface of the wafer are large (if the surface roughness is large), this poses problems with the occurrence of particles in the device manufacturing process and a decrease in productivity in a polishing process.

To address such problems, a technology disclosed in, for example, Japanese Patent Laid-Open Publication No. 2003-229392 has been suggested, in which a alkaline solution with a high concentration (equal to or larger than 50 weight percent) is used to control the etching speed and lessen the influence of anisotropy, thereby decreasing the size of the facet to improve the surface roughness. However, the alkaline solution with a high concentration may be frozen in winter, thereby posing a problem in view of convenience.

Thus, there has been strong demand for providing an alkaline etching solution for silicon wafers which is capable of improving the surface roughness of wafers without using the alkaline solution with high concentration.

SUMMARY OF THE INVENTION

An object of the present invention is to provide an alkaline etching solution capable of improving surface roughness even with a relatively lower alkaline concentration than has been conventionally used, an alkaline etching method using the solution, a silicon-wafer manufacturing method using the solution, and further a silicon wafer obtained through the method with its surface roughness being improved. The inventors have diligently studied in order to develop an excellent alkaline etching solution that satisfies the demands described above and, as a result, have surprisingly and unexpectedly found, that these and other objects can be achieved by using a bromate containing alkaline etching solution as a caustic alkaline aqueous solution, the size of facets occurring on the surface of a silicon wafer can be reduced. Also, the inventors have found that effects of bromate can be extended by adding nitrate.

DETAILED DESCRIPTION OF THE PREFERRED EMBODIMENT

Thus, the present invention relates to an alkaline etching solution in which an alkaline aqueous solution contains bromate, and preferably contains bromate and nitrate. The invention further relates to the alkaline etching solution, wherein the bromate is sodium bromate, and yet further, wherein the nitrate is sodium nitrate.

The invention also relates to a method of etching a silicon wafer with an alkaline solution, wherein the alkaline solution is a caustic alkaline aqueous solution containing bromate, preferably containing bromate and nitrate, and to a silicon-wafer etching method, wherein the bromate is sodium bromate, and preferably where nitrate is also present, more preferably wherein the nitrate is sodium nitrate.

Still further, the present invention relates to a method of manufacturing a semiconductor silicon wafer, comprising the step of performing alkaline etching by using a caustic alkaline aqueous solution containing bromate, wherein a wafer after the etching has a surface roughness Ra equal to or smaller than 0.27 µm.

By using the alkaline etching solution containing bromate, the size of facets can be significantly reduced and the surface roughness of the wafer can be improved without significant decrease in etching speed, compared with the case of using a caustic alkaline aqueous solution conventionally used in general. Also, the surface roughness can be sufficiently improved without a high-concentration alkaline aqueous solution. Therefore, alkaline etching can be conveniently performed. Furthermore, by using an alkaline etching solution containing bromate and nitrate, bromate consumption is suppressed in the course of alkaline etching, thereby keeping the above-described effects. Thus, it is possible to perform alkaline etching capable of obtaining a wafer with improved surface roughness in an extremely economical manner with a low environmental load.

The silicon wafers capable of being etched by apply the etching solution of the present invention are not particularly restricted. The etching solution of the present invention can be applied to various silicon wafers conventionally known to the art. Specifically, there are no limitations in size (diameter and thickness), the presence or absence of doping with various elements, or the presence or absence of preprocessing steps.

The alkaline etching solution according to the present invention has the feature in which to a conventionally-known alkaline etching solution for silicon wafers, a small amount of bromate is added. Here, the alkaline etching solution means an aqueous solution containing an alkaline component as an etching component and, if required, other components. The actual composition of the alkaline etching solution usable in the present invention is not particularly restrictive as long as it is a conventionally-known alkaline etching solution for silicon wafers, including those commercially available. The alkaline etching solution can be selected appropriately in view of a desired etching characteristic and characteristics of a semiconductor wafer to be etched. As an alkaline component, an inorganic alkali hydroxide is preferable. In particular, sodium hydroxide, potassium hydroxide, and lithium hydroxide, and a mixture thereof are preferable. In the present invention, the use of sodium hydroxide is particularly preferable.

Also, the concentration of the alkaline component is not particularly restrictive and can be selected appropriately according to etching conditions and others. A general range of concentration of the alkaline component is 20 to 60 weight percent and, preferably, 45 to 50 weight percent. Here, the concentration of the alkaline component represents a weight percent of alkaline hydroxide in the aqueous solution. If the concentration is lower than the above range, it is difficult to control the etching speed and suppress a facet on the surface. A concentration higher than the above range is not preferable because of posing problems such as insolubility of bromate in a high-concentration alkaline aqueous solution and freezing of the alkaline aqueous solution itself.

Furthermore, the purity of the alkaline component usable in the present invention is not particularly restrictive and can be selected appropriately in consideration of the degree of metallic contamination associated with etching. In a semiconductor manufacturing process, a commercially-available solution with high purity can be used as it is. Also, as generally required, the solution is preferably formulated from an alkaline component with a low concentration of metallic impurities contained therein, with ultrapure water.

Still further, since the concentration of the alkaline component varies according to the etching, it is preferable to appropriately measure the concentration at the time of use or the like, and re-supply an etching solution component thereof, or water as required. A measurement can be performed by using, for example, neutralization titration. Still further, although normal storage conditions will suffice, an environment that can prevent the occurrence of alkaline carbonate, which will cause a change in concentration and affect etching, is preferable.

The alkaline etching solution according to the present invention has a feature of containing bromate. Here, the bromate is not particularly restrictive, and can include sodium bromate, potassium bromate, and lithium bromate, for example. In particular, the sodium salt is preferable. As the bromate, those commercially available can be used as is or after purification.

The concentration of the bromate is not particularly restrictive. A preferable range is 0.01 to 10 weight percent, more preferably, 0.1 to 3.0 weight percent, and still more preferably, 0.1 to 1.0 weight percent. If the concentration is too low, a sufficient improvement in surface roughness cannot be obtained. Also, a concentration higher than the above range is not preferable in view of cost and possible introduction of impurities from the bromate.

A method of adding the bromate is not particularly restrictive. The bromate can be dissolved in advance before use and stored, and can be used as is for etching. Alternatively, the solution can be formulated at the time of use for etching. On the other hand, the inventors have found that, when a bromate-containing alkaline etching solution is used for etching, as the number of times of etching is increased, the effect of addition of the bromate is decreased. Since the alkaline etching solution may be used under different etching conditions or used for etching of silicon wafers of various shapes, it is preferable to calculate the dissolved amount of silicon in the etching solution that can be found from the amount of etching, in place of the number of times of etching. Therefore, if the dissolved amount of silicon is increased and the effect is decreased, the etching solution may be replaced, or further bromate may be added.

Another feature of the alkaline etching solution according to the present invention is that nitrate is preferably added in addition to bromate. Effects of the nitrate are based on unexpected findings described below obtained by the inventors. That is, in an alkaline etching method using a bromate-added caustic alkaline aqueous solution, the facet size is indeed excellently controlled and can be extremely decreased, thereby obtaining a silicon wafer with an improved surface roughness. However, if such an alkaline etching solution is repeatedly used, the above effects are decreased. However, when the alkaline etching solution with nitrate further added thereto is used, the above effects can be kept without reduction.

The nitrate to be added for this purpose is not particularly restrictive, and can include sodium nitrate, potassium nitrate, and lithium nitrate of high purity. In the present invention, sodium nitrate is preferable. As the nitrate, those commercially available can be used as is or after purification.

The concentration of the nitrate is not particularly restrictive. A preferable range for use to achieve the effects is 0.01 to 10.0 weight percent. In particular, the nitrate is preferably equimolecular to or more than the bromate. By adding the nitrate equimolecular to or more than the bromate being added, the above effects can be kept for the longer time even when the alkaline etching solution is used repeatedly.

The method of adding the nitrate is also not particularly restrictive. The nitrate can be added to the alkaline aqueous solution irrespectively of the order of addition of the bromate. Also, the nitrate can be dissolved in advance before use and stored and can be used as is for etching. Alternatively, the solution can be formulated at the time of use.

The alkaline etching method according to the present invention has a feature of using any of the above alkaline etching solutions and, in particular, the method is for semiconductor wafers, preferably silicon wafers.

Etching conditions for use in the alkaline etching method according to the present invention are not particularly restrictive. Conditions that are set when a conventionally-known alkaline etching solution is used are preferable and, according to the type of a semiconductor wafer to be etched (size, thickness, crystal orientation), any etching amount, etching speed, etching time, temperature, agitation, and other parameters can be selected appropriately.

Furthermore, an etching apparatus usable for the alkaline etching method according to the present invention is not particularly restrictive. An apparatus used when a conventionally-known alkaline etching solution is used is preferable and, according to the type of a semiconductor wafer to be etched and the etching conditions, any apparatus can be selected appropriately. Specifically, for example, an etching bath having a circulating system, such as a circulating pump, a filter, and a heater, is usable.

The etching method using the alkaline etching solution containing bromate according to the present invention is excellent in that a silicon wafer with an improved surface roughness can be obtained. On the other hand, only with bromate, the effects decrease as etching is repeated. Therefore, the degree of repeated use is preferably determined by performing etching using an appropriate standard test sample and measuring surface roughness of a silicon wafer obtained with respect to the dissolved amount of silicon in the etching solution for comparison.

Also, the etching method using the alkaline etching solution containing bromate and nitrate suppresses a decrease in the effects of the bromate in accordance with repetition of etching, and therefore can be used repeatedly. Also in this case, the degree of such repeated use is preferably determined by performing etching using an appropriate standard test sample and measuring surface roughness of a silicon wafer obtained with respect to the dissolved amount of silicon in the etching solution for comparison.

The semiconductor-silicon-wafer manufacturing method according to the present invention has a feature of performing alkaline etching by using the alkaline etching solution according to the present invention to manufacture a semiconductor silicon wafer.

The semiconductor silicon wafer manufactured through the manufacturing method according to the present invention is particularly excellent in surface roughness. The surface roughness can be evaluated through various measuring schemes according to various purposes. In particular, such an evaluation can be made from the surface roughness and/or surface glossiness measured through various measuring means conventionally known. Specific measuring apparatuses and methods include Surftest SJ-201P from Mitsutoyo Corporation for surface roughness and a glossmeter PG-1M from Nippon Denshoku Industries, Co., Ltd., for surface glossiness.

Furthermore, the purpose of visually evaluating the shape of facet can be fulfilled by observing the shape of the surface. Specifically, a surface observation by a microscope is a preferable evaluation method. With this, for example, the shape, size, and depth of the facet can be evaluated.

The present invention is described in more detail below with reference to the examples, but is not restricted to these examples.

EXAMPLES

In examples and comparative examples described below, the following evaluation method was used.

"Wafer Evaluation Test Scheme"

(1) Etching speed (etching rate: μm/sec): Ultragate 9700 from ADE was used to measure the thickness of the center of a wafer before and after etching, and an etching speed was calculated based on the following equation:

Etching speed:Thickness before etching−Thickness after etching)/etching time.

(2) Wafer surface roughness: Surftest SJ-201P from Mitsutoyo Corporation was used to measure Ra based on JIS B0601-1994.

(3) Wafer surface glossiness: A glossmeter PG-1M from Nippon Denshoku Industries, Co., Ltd. was used to measure the glossiness based on JIS Z8741/K5400 with a lighting/light-receiving angle of 60 degrees.

(4) Etching surface observation: A surface-shape measurement microscope VF-7500 from Keyence Corporation was used for wafer surface observation after etching (magnification: 100×).

Example 1

Alkaline Etching Solution Containing Sodium Bromate and Sodium Nitrate, Dissolved Amount of Silicon: 0 g/L In a caustic alkaline aqueous solution of 65 L of 48 weight percent of sodium hydroxide (48% of CLEARCUT-S from Tsurumi Soda Co., Ltd.), 196 g of sodium bromate (from Wako Pure Chemical Industries, Ltd., a Wako reagent chemicals and 111 g of sodium nitrate (from Wako Pure Chemical Industries, Ltd., reagent chemicals were dissolved to formulate an alkaline aqueous solution containing 0.20 weight percent of sodium bromate and 0.11 weight percent of sodium nitrate as an alkaline etching solution. With the formulated alkaline etching solution, a block-type etching bath with a filling capacity of 65 liters was filled. In the etching bath, twenty silicon wafers having a diameter of eight inches previously subjected to double-sided lapping were immersed loaded on a carrier. With the wafers rotated in the aqueous solution together with the carrier (20 rpm), etching was performed to remove approximately 25 μm on both sides for approximately seven minutes at a liquid temperature of 90 degrees Celsius. The wafers were then moved to a water washing bath for cleaning and drying. The etching speed, wafer surface roughness, and wafer surface glossiness of the resultant wafers were measured by the above-described testing methods. The results are shown in Table 1. Also, in FIG. 1, the surface roughness of the resultant wafers is plotted with respect to the dissolved amount of silicon. Furthermore, a microphotograph of the surface of a resultant wafer was shot and shown in FIG. 2.

Example 2

Alkaline Etching Solution Containing Sodium Bromate and Sodium Nitrate, Dissolved Amount of Silicon: 0.3 g/L Etching similar to that of Example 1 was repeatedly performed without replacing the etching solution after the process of Example 1, thereby using an alkaline aqueous solution with the dissolved amount of silicon of 0.3 g/L as the etching solution. Silicon wafers were etched in a manner similar to that of Example 1. The etching speed, wafer surface roughness, and wafer surface glossiness of the resultant wafers were measured. The results are shown in Table 1. Also, in FIG. 1, the surface roughness of the resultant wafers is plotted with respect to the dissolved amount of silicon.

Example 3

Alkaline Etching Solution Containing Sodium Bromate and Sodium Nitrate, Dissolved Amount of Silicon: 0.6 g/L In a manner similar to that of Example 2, an alkaline aqueous solution with its silicon concentration of 0.6 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Example 4

Alkaline Etching Solution Containing Sodium Bromate and Sodium Nitrate, Dissolved Amount of Silicon: 0.9 g/L In a manner similar to that of Example 2, an alkaline aqueous solution with its silicon concentration of 0.9 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Example 5

Alkaline Etching Solution Containing Sodium Bromate and Sodium Nitrate, Dissolved Amount of Silicon: 1.2 g/L In a manner similar to that of Example 2, an alkaline aqueous solution with its silicon concentration of 1.2 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Example 6

Alkaline Etching Solution Containing Sodium Bromate and Sodium Nitrate, Dissolved Amount of Silicon: 1.5 g/L In a manner similar to that of Example 2, an alkaline aqueous solution with its silicon concentration of 1.5 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Example 7

Alkaline Etching Solution Containing Sodium Bromate and Sodium Nitrate, Dissolved Amount of Silicon: 1.8 g/L In a manner similar to that of Example 2, an alkaline aqueous solution with its silicon concentration of 1.8 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Example 8

Alkaline Etching Solution Containing Sodium Bromate and Sodium Nitrate, Dissolved Amount of Silicon: 2.1 g/L In a manner similar to that of Example 2, an alkaline aqueous solution with its silicon concentration of 2.1 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Example 9

Alkaline Etching Solution Containing Sodium Bromate and Sodium Nitrate, Dissolved Amount of Silicon: 2.4 g/L In a manner similar to that of Example 2, an alkaline aqueous solution with its silicon concentration of 2.4 g/L was used as the etching solution. Silicon wafers were etched in a manner similar to that of Example 1, and the etching speed, wafer surface roughness, and wafer surface glossiness of the resultant wafers measured. The results are shown in Table 1.

Figure 1:
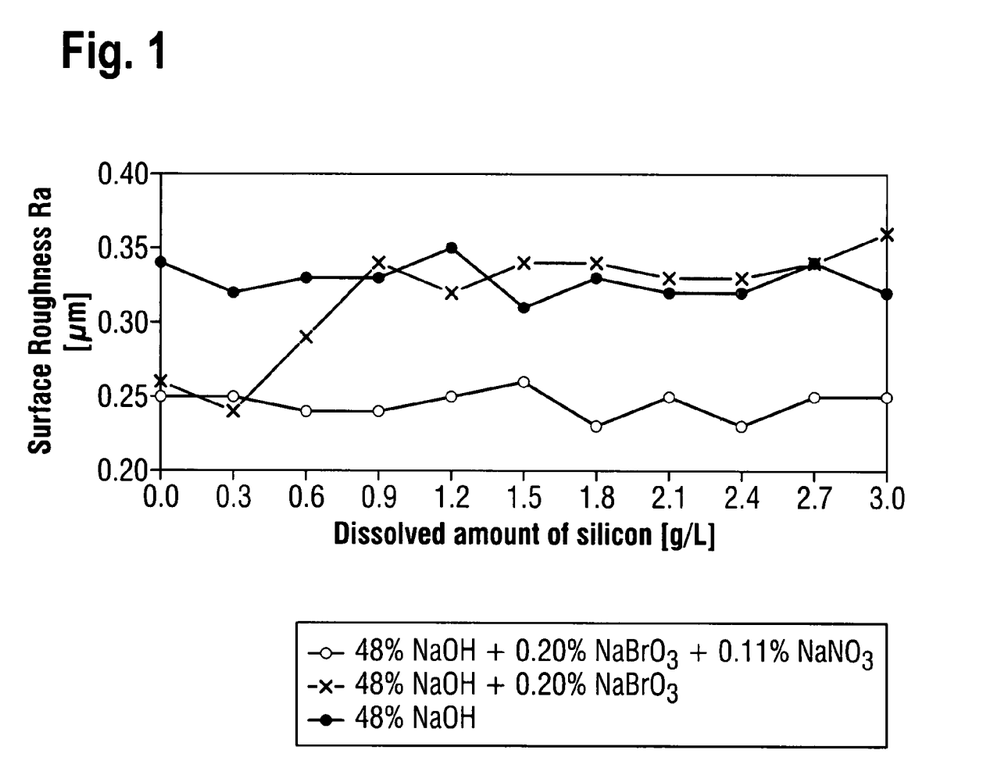
FIG. 1 shows a graph depicting the results of Examples 1 to 14 and Comparative Examples 1 to 9. The horizontal axis represents dissolved amount of silicon (g/L) and the vertical axis represents a surface roughness (μm) of a wafer obtained. The hollow circles represent alkaline etching solution containing sodium bromate and sodium nitrate (Examples 1 to 11), the crosses represent alkaline etching solution containing sodium bromate (Examples 12 to 14 and Comparative Examples 1 to 8), and black circles represent alkaline etching solution of 48% NaOH (Comparative Example 9)
Figure 2:
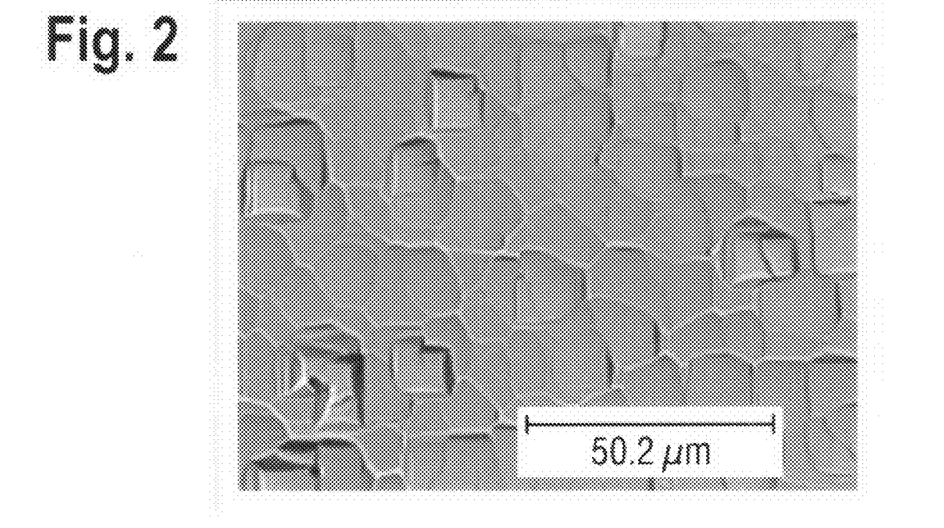
FIG. 2 shows a micrograph (magnification: 100×) of a wafer surface obtained through Example 1.

Also, in FIG. 1, the surface roughness of the resultant wafers is plotted with respect to the dissolved amount of silicon.

Example 10

Alkaline Etching Solution Containing Sodium Bromate and Sodium Nitrate, Dissolved Amount of Silicon: 2.7 g/L In a manner similar to that of Example 2, an alkaline aqueous solution with its silicon concentration of 2.7 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Example 11

Figure 3:
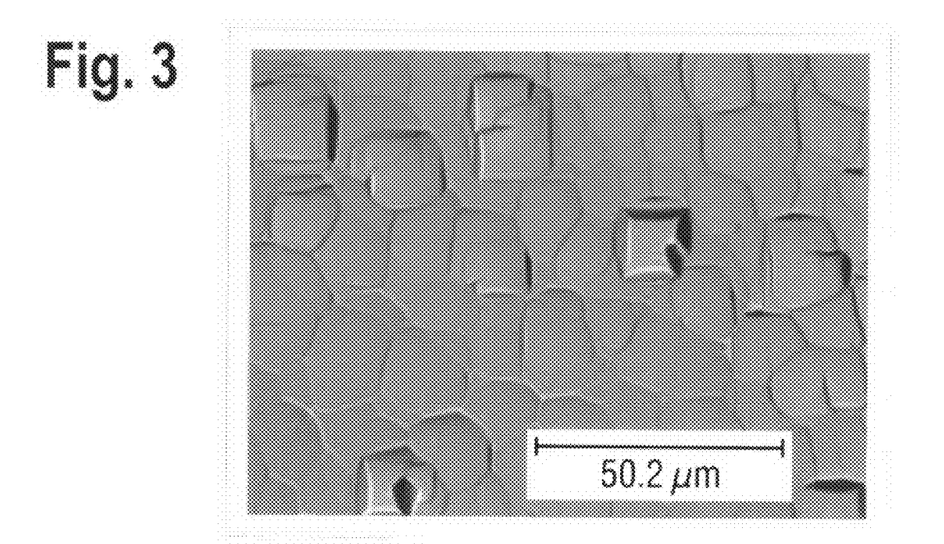
FIG. 3 shows a micrograph (magnification: 100×) of a wafer surface obtained through Example 11.

Alkaline Etching Solution Containing Sodium Bromate and Sodium Nitrate, Dissolved Amount of Silicon: 3.0 g/L In a manner similar to that of Example 2, an alkaline aqueous solution with its silicon concentration of 3.0 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon. Furthermore, a microphotograph of the surface of a resultant wafer was shot and shown in FIG. 3.

Example 12

Figure 4:
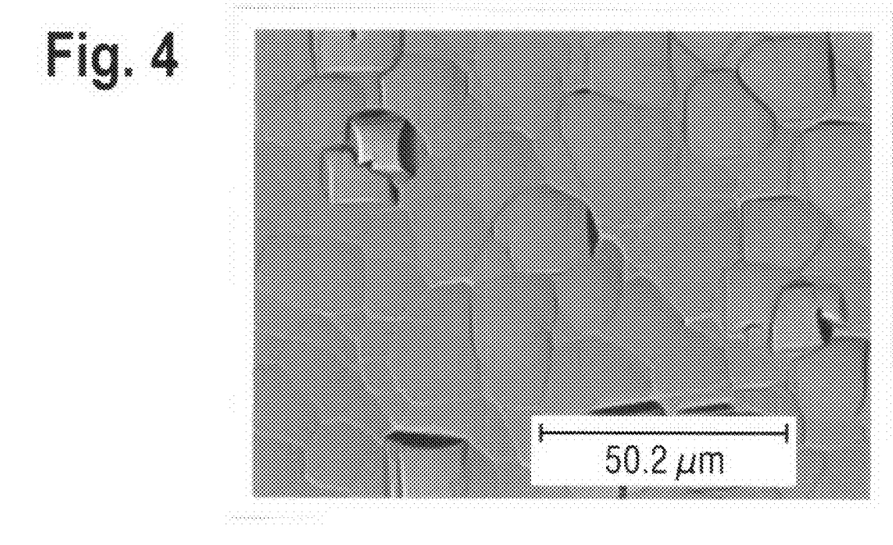
FIG. 4 shows a micrograph (magnification: 100×) of a wafer surface obtained through Example 12.

Alkaline Etching Solution Containing Sodium Bromate, Dissolved Amount of Silicon: 0 g/L An alkaline aqueous solution was formulated in a manner similar to Example 1 except that sodium nitrate was not added, and used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon. Furthermore, a microphotograph of the surface of a resultant wafer was shot and shown in FIG. 4.

Example 13

Alkaline Etching Solution Containing Sodium Bromate, Dissolved Amount of Silicon: 0.3 g/L Etching similar to that of Example 1 was repeatedly performed without replacing the etching solution after the process of Example 12, thereby using an alkaline aqueous solution with the dissolved amount of silicon of 0.3 g/L as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Example 14

Alkaline Etching Solution Containing Sodium Bromate, Dissolved Amount of Silicon: 0.6 g/L In a manner similar to that of Example 13, an alkaline aqueous solution with its silicon concentration of 0.6 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Comparative Example 1

Alkaline Etching Solution Containing Sodium Bromate, Dissolved Amount of Silicon: 0.9 g/L In a manner similar to that of Example 13, an alkaline aqueous solution with its silicon concentration of 0.9 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Comparative Example 2

Alkaline Etching Solution Containing Sodium Bromate, Dissolved Amount of Silicon: 1.2 g/L In a manner similar to that of Example 13, an alkaline aqueous solution with its silicon concentration of 1.2 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Comparative Example 3

Alkaline Etching Solution Containing Sodium Bromate, Dissolved Amount of Silicon: 1.5 g/L In a manner similar to that of Example 13, an alkaline aqueous solution with its silicon concentration of 1.5 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Comparative Example 4

Alkaline Etching Solution Containing Sodium Bromate, Dissolved Amount of Silicon: 1.8 g/L In a manner similar to that of Example 13, an alkaline aqueous solution with its silicon concentration of 1.8 g/L was used as the etching solution. Silicon wafers were etched in a manner similar to that of Example 1, and the etching speed, wafer surface roughness, and wafer surface glossiness of the resultant wafers measured. The results are shown in Table 1.

Also, in FIG. 1, the surface roughness of the resultant wafers is plotted with respect to the dissolved amount of silicon.

Comparative Example 5

Alkaline Etching Solution Containing Sodium Bromate, Dissolved Amount of Silicon: 2.1 g/L In a manner similar to that of Example 13, an alkaline aqueous solution with the dissolved amount of silicon of 2.1 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Comparative Example 6

Alkaline Etching Solution Containing Sodium Bromate, Dissolved Amount of Silicon: 2.4 g/L In a manner similar to that of Example 13, an alkaline aqueous solution with its silicon concentration of 2.4 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Comparative Example 7

Alkaline Etching Solution Containing Sodium Bromate, Dissolved Amount of Silicon: 2.7 g/L In a manner similar to that of Example 13, an alkaline aqueous solution with its silicon concentration of 2.7 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon.

Comparative Example 8

Figure 5:
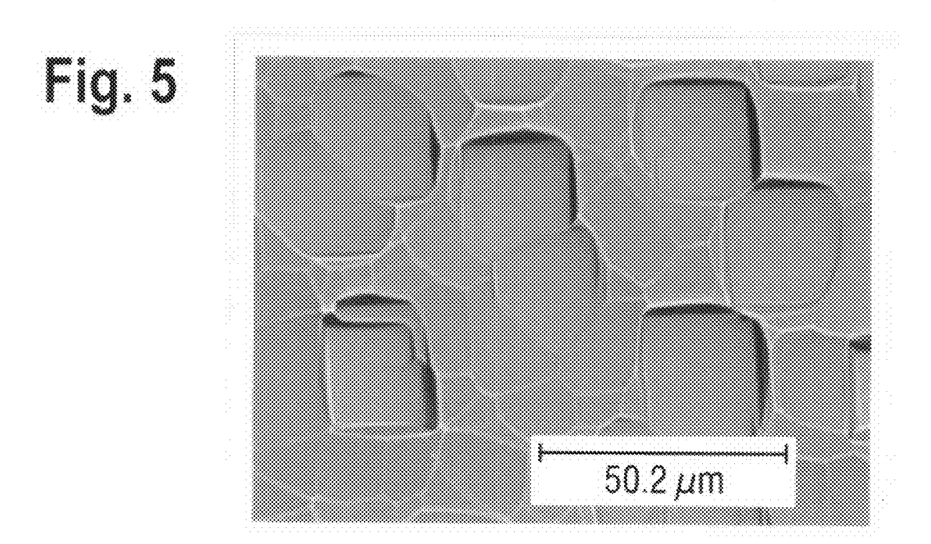
FIG. 5 shows a micrograph (magnification: 100×) of a wafer surface obtained through Comparative Example 8.

Alkaline Etching Solution Containing Sodium Bromate, Dissolved Amount of Silicon: 3.0 g/L In a manner similar to that of Example 13, an alkaline aqueous solution with its silicon concentration of 3.0 g/L was used as the etching solution. Silicon wafers were etched in a manner similar to that of Example 1, and the etching speed, wafer surface roughness, and wafer surface glossiness of the resultant wafers measured. The results are shown in Table 1. Also, in FIG. 1, the surface roughness of the resultant wafers is plotted with respect to the dissolved amount of silicon. Furthermore, microphotograph of the surface of a resultant wafer was shot and shown in FIG. 5.

Comparative Example 9

48% Sodium Hydroxide Aqueous Solution

Figure 6:
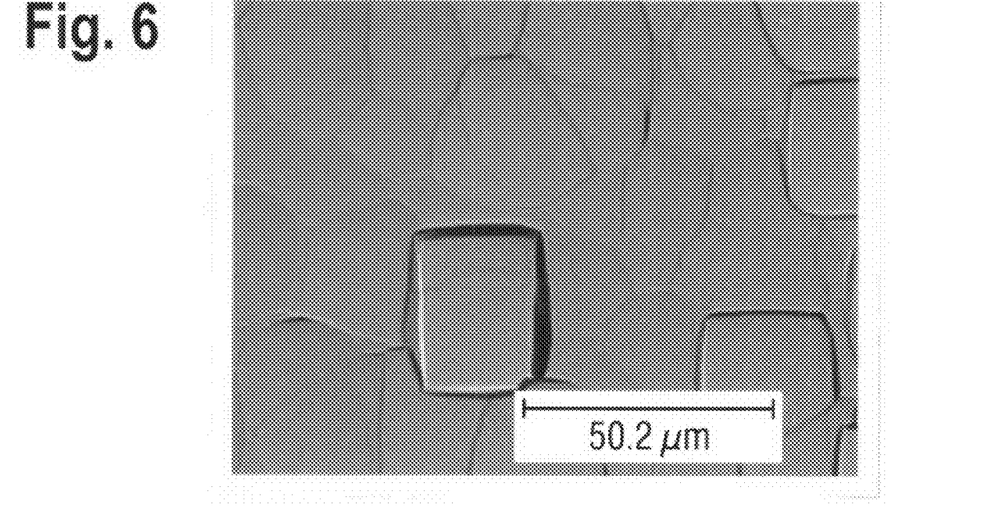
FIG. 6 shows a micrograph (magnification: 100×) of a wafer surface obtained through Comparative Example 9 (dissolved amount of silicon: 0 g/L)
Figure 7:
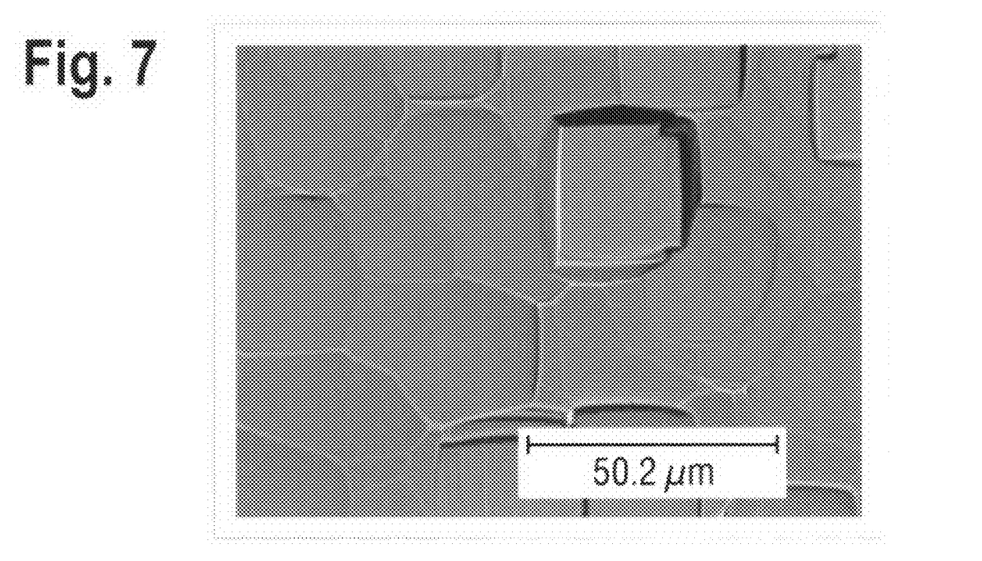
FIG. 7 shows a micrograph (magnification: 100×) of a wafer surface obtained Comparative Example 9 (dissolved amount of silicon: 3.0 g/L).

An alkaline aqueous solution was formulated in a manner similar to Example 1 used as the etching solution, except that neither sodium bromate nor sodium nitrate was added. In a manner similar to those of Examples 1 to 11, alkaline aqueous solutions each with the dissolved amount of silicon (g/L) being 0, 0.3, 0.6, 0.9, 1.2, 1.5, 1.8, 2.1, 2.4, 2.7, 3.0 were used as the etching solutions to etch silicon wafers in a manner similar to that of Example 1. The etching speed, wafer surface roughness, and wafer surface glossiness of the resultant wafers were measured and the results presented in Table 1. Also, in FIG. 1, the surface roughness of the resultant wafers is plotted with respect to the dissolved amount of silicon. Furthermore, microphotographs of the surfaces of the resultant wafers obtained by using the etching solutions with concentrations of dissolved silicon of 0 g/L and 3.0 g/L were taken and shown in FIGS. 6 and 7, respectively.

TABLE 1

| Evaluation | Dissolved amount of silicon in etching solution [g/L] | Etching speed [μm/sec] | Surface roughness Ra [μm] | Glossiness |
|---|---|---|---|---|
| Example 1 | 0 | 0.059 | 0.25 | 91.7 |
| Example 2 | 0.3 | 0.060 | 0.25 | 80.5 |
| Example 3 | 0.6 | 0.058 | 0.24 | 89.1 |
| Example 4 | 0.9 | 0.060 | 0.24 | 88.8 |
| Example 5 | 1.2 | 0.058 | 0.25 | 85.7 |
| Example 6 | 1.5 | 0.059 | 0.26 | 87.6 |
| Example 7 | 1.8 | 0.060 | 0.23 | 90.5 |
| Example 8 | 2.1 | 0.059 | 0.25 | 91.1 |
| Example 9 | 2.4 | 0.059 | 0.23 | 86.7 |
| Example 10 | 2.7 | 0.060 | 0.25 | 88.8 |
| Example 11 | 3.0 | 0.059 | 0.25 | 97.7 |
| Example 12 | 0 | 0.059 | 0.26 | 89.9 |
| Example 13 | 0.3 | 0.059 | 0.24 | 89.7 |
| Example 14 | 0.6 | 0.061 | 0.29 | 110.2 |
| Comparative Example 1 | 0.9 | 0.063 | 0.34 | 111.1 |
| Comparative Example 2 | 1.2 | 0.064 | 0.32 | 118.6 |
| Comparative Example 3 | 1.5 | 0.064 | 0.34 | 119.3 |
| Comparative Example 4 | 1.8 | 0.062 | 0.34 | 119.2 |
| Comparative Example 5 | 2.1 | 0.064 | 0.33 | 118.4 |
| Comparative Example 6 | 2.4 | 0.063 | 0.33 | 118.9 |
| Comparative Example 7 | 2.7 | 0.064 | 0.34 | 121.1 |
| Comparative Example 8 | 3.0 | 0.064 | 0.36 | 117.4 |
| Comparative Example 9 | 0 | 0.062 | 0.36 | 120.5 |
|  | 0.3 | 0.064 | 0.32 | 121.5 |
|  | 0.6 | 0.063 | 0.33 | 120.3 |
|  | 0.9 | 0.065 | 0.33 | 119.7 |
|  | 1.2 | 0.064 | 0.35 | 122.1 |
|  | 1.5 | 0.063 | 0.31 | 122.6 |
|  | 1.8 | 0.063 | 0.33 | 123.9 |
|  | 2.1 | 0.064 | 0.32 | 123.6 |
|  | 2.4 | 0.064 | 0.32 | 124.5 |
|  | 2.7 | 0.062 | 0.34 | 124.1 |
|  | 3.0 | 0.064 | 0.32 | 123.8 |

From Table 1 and FIG. 1, in alkaline etching using an alkaline etching solution containing sodium bromate and sodium nitrate (Examples 1 to 11) and an alkaline etching solution containing sodium bromate (Examples 12 to 14), it is apparent that the surface roughness can be significantly improved compared with alkaline etching using a 48% sodium hydroxide aqueous solution containing neither sodium bromate nor sodium nitrate as an alkaline etching solution (Comparative Example 9). Furthermore, in the alkaline etching solution containing sodium bromate and sodium nitrate (Examples 4 to 11), in comparison with the alkaline etching solution containing sodium bromate (Comparative Examples 1 to 8), it can be seen that, even when the dissolved amount of silicon in the etching solution is increased due to repeated use, the effects can be kept and a silicon wafer with an improved surface roughness can be achieved.

Also, in comparison with FIGS. 2 to 4 and FIGS. 5 to 7, the size of facets can be significantly reduced by using the alkaline etching solution according to the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of etching a silicon wafer with an alkaline solution, comprising etching the silicon wafer with a caustic alkaline aqueous solution containing bromate and nitrate.

2. The method of claim 1, wherein the bromate is sodium bromate.

3. The method of claim 1, wherein the nitrate is sodium nitrate.

4. A method of manufacturing a silicon wafer, comprising the step of etching the semiconductor silicon wafer by the method of claim 1, wherein the wafer after etching has a surface roughness Ra equal to or smaller than 0.27 μm.

5. The method of claim 1, wherein the caustic alkaline aqueous solution comprises an alkali hydroxide in a concentration of 20-60% by weight.

6. The method of claim 5, wherein the caustic alkaline aqueous solution comprises an alkali hydroxide in a concentration of 45-50% by weight.

7. The method of claim 1, wherein the concentration of the bromate is 0.01 to 10% by weight.

8. The method of claim 1, wherein the concentration of the nitrate is 0.01 to 10% by weight.

9. The method of claim 1, wherein the nitrate and the bromate are present in equimolar amounts.

* * * * *